(12) United States Patent
Nayyar et al.

(10) Patent No.: US 10,691,862 B2
(45) Date of Patent: Jun. 23, 2020

(54) LAYOUTS FOR CONNECTING CONTACTS WITH METAL TABS OR VIAS

(71) Applicant: GLOBALFOUNDRIES INC., Grand Cayman (KY)

(72) Inventors: Neha Nayyar, Clifton Park, NY (US); Daniel J. Dechene, Watervliet, NY (US); David C. Pritchard, Glenville, NY (US); George J. Kluth, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 293 days.

(21) Appl. No.: 15/644,288

(22) Filed: Jul. 7, 2017

(65) Prior Publication Data
US 2019/0012422 A1    Jan. 10, 2019

(51) Int. Cl.
*G06F 30/394* (2020.01)
*H01L 23/522* (2006.01)
*H01L 21/8234* (2006.01)

(52) U.S. Cl.
CPC ........ *G06F 30/394* (2020.01); *H01L 23/5226* (2013.01); *H01L 21/823475* (2013.01); *H01L 21/823481* (2013.01)

(58) Field of Classification Search
USPC .......................................................... 716/54
See application file for complete search history.

(56) References Cited

U.S. PATENT DOCUMENTS

| 8,415,089 | B1 | 4/2013 | Gupta et al. | |
|---|---|---|---|---|
| 2008/0109770 | A1* | 5/2008 | Kim | G06F 17/5036 716/122 |
| 2012/0102441 | A1* | 4/2012 | Aton | G03F 1/36 716/54 |
| 2012/0295186 | A1* | 11/2012 | Hsieh | G03F 1/50 430/5 |
| 2014/0282301 | A1 | 9/2014 | Wang et al. | |
| 2016/0086887 | A1 | 3/2016 | Lee et al. | |

OTHER PUBLICATIONS

Chen et al., "56 nm Pitch Copper Dual-Damascene Interconnects With Triple Pitch Split Metal and Double Pitch Split via", IEEE, 2012, 3 pages.
Changxing Ding et al., "Multi-Directional Multi-Level Dual-Cross Patterns for Robust Face Recognition" IEEE Trans. Pattern Anal. Mack Intell., Aug. 6, 2015, 15 pages.

* cited by examiner

*Primary Examiner* — Eric D Lee
(74) *Attorney, Agent, or Firm* — David Cain; Andrew M. Calderon; Roberts Calderon Safran & Cole, P.C.

(57) ABSTRACT

The present disclosure relates to methodologies for designing semiconductor structures, and, more particularly, creating a methodology to connect contacts of semiconductor elements to a metal line using marker tabs to reserve space for future connections between the contacts and the metal line, and then reassigning the marker tabs to connections between the contacts and the metal line on different levels of a metal stack formed over the semiconductor elements.

20 Claims, 3 Drawing Sheets

LAYOUTS FOR CONNECTING CONTACTS WITH METAL TABS OR VIAS

FIELD OF THE DISCLOSURE

The present disclosure relates to semiconductor structures and, more particularly, to connections between contacts of semiconductor structures and metal lines spaced apart from the contacts, and methods of manufacture.

BACKGROUND

As technology advances in designing integrated circuit (IC) chips, such as FDSOI (Fully Depleted Silicon-on-Insulator) devices, problems develop as the elements formed on the IC chips are required to become smaller and smaller. For example, in FDSOI technology, a problem arises if contacts, such as source/drain contacts, are directly connected over Shallow Trench Isolation (STI) regions to metal lines, such as power supply rails connected to a plurality of individual semiconductor devices connected to the source/drain contacts. In such structures, shorts are likely to occur between the contacts and the substrate in the areas where the contacts extend over the STI regions. This happens because the contacts for the transistor regions (e.g., in FDSOI devices) and for the source/drain regions are formed with the same etching mask, which makes the etching process difficult to control. Thus, punch through to the substrate can occur.

One solution has been to limit the contacts to only over the source/drain regions, such that they do not extend over the STI. In this solution metal tabs are used at a higher level than the source/drain contacts to connect between the source/drain contacts and adjacent common metal lines, e.g., power supply rails. In other words, the metal tabs extend over the STI regions which surround the source/drain regions, rather than the source/drain contacts themselves extending over the STI region. This helps to avoid short circuits to the substrate because the metal tabs are located at a higher level above the STI regions than the source/drain contacts, so punch through to the substrate is not likely to occur, even at tighter tolerances.

This solution works well for relaxed pitches, but problems can still exist for tighter pitches. For example, as smaller pitches between the metal tabs are used, problems in excessive variation of the process variation (PV) band become a printing concern. The PV band variation correlates to how the lines formed by lithography will actually print. As metal tabs become closer together due to smaller pitches required for smaller devices, the variation of the PV band can become much larger than its acceptable range. For example, the PV band variation for pitches of 22 nm or less between adjacent metal tabs on the same metallization level is unacceptable since the manufactured contacts might overlay edges of the source/drain regions, resulting in shorts.

Another constraint from the design side is that it is very hard to decide apriori if a tab is going to be used as a metal tab at a first metallization level or as a via at a second metallization level. In other words, because of cell placement, it is difficult to predict if the adjacent cell will have a metal tab or a via tab.

SUMMARY

In an aspect of the disclosure, a method is provided which is implemented in a computer infrastructure for creating a methodology to connect assign marker tabs for connecting contacts of semiconductor elements to a metal line to reserve space for future actual connections between the contacts and the metal line. The marker tabs are then reassigned to be connections between the contacts and the metal line on different levels of a metal stack formed over the semiconductor elements.

In another aspect of the disclosure, a system is provided for connecting source/drain contacts to a metal line separated from the source/drain contacts by an STI layer. The system comprises a CPU, a computer readable memory and a computer readable storage device, and is configured to connect the source/drain contacts to the metal line with marker tabs to reserve space for future connections between the source/drain contacts and the metal line. Across layer reassignment of the marker tabs is then performed by the system to assign a first group of the marker tabs to be metal tabs to connect a first group of the source/drain contacts to the metal line at a first level of a metal stack formed over the source/drain contacts and the STI layer, and to assign a second group of the marker tabs to be vias to connect a second group of the source/drain contacts to the metal line at a second layer of the metal stack which is at a different level than the first layer of the metal stack.

In another aspect of the disclosure, a computer program product is provided comprising a computer readable hardware storage device having readable program code embodied in the computer readable hardware storage device. The computer program product includes at least one component to assign marker tabs to connect contacts of semiconductor elements to a metal line to reserve space for future connections between the contacts and the metal line. The marker tabs are then reassigned to connections between the contacts and the metal line on different levels of a metal stack formed over the semiconductor elements.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
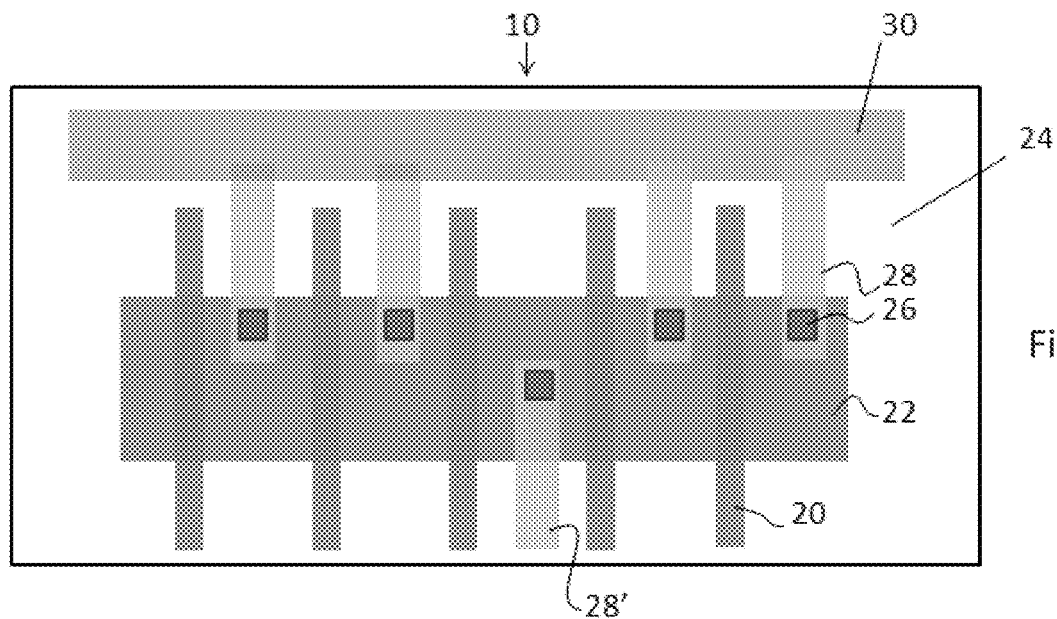
FIG. 1 shows a design layout for an IC chip in accordance with aspects of the present disclosure.

The present disclosure relates to semiconductor structures and, more particularly, to a connecting contacts of semiconductor structures, such as contacts on source/drain regions, by either metal tabs or via tabs to metal lines. More specifically, the present disclosure provides for connecting contacts, e.g., source/drain contacts, using either metal tabs or vias in a manner which allows compact design space while still achieving acceptable PV band variations. Advantageously, the present disclosure provides connections using multiple layers across a metal stack to connect contacts for semiconductor elements, e.g., source/drain contacts, to common metal lines, e.g., power rails, in spite of very tight pitches without punch through shorts and with acceptable PV band variations.

In accordance with the present disclosure, markers are placed on the contacts that are to be connected out, and then during Across Layer Reassignment (ALR), these tabs are assigned to different layers of an overlying metal stack, depending on the environment. In particular, to avoid problems between adjacent connectors (such as the metal tabs or vias) between source/drain contacts and common metal lines across the STI layer, during the ALR the marker tabs are replaced with alternating connectors selected from metal tabs and vias. The metal tabs are on one level of a metal stack and the vias provide for connection using via tabs at a different level of metal stack. The metal tabs are each generally located between two vias and the vias are generally located between two metal tabs. As such, adjacent metal tabs are separated from one another by a via. This prevents connections being directly adjacent one another at the same level of the metal stack, thereby reducing shorts caused by small pitch values.

In embodiments, the methods described herein use existing layers, thereby reducing the mask count for middle of line processes (MOL). In addition, the methods described herein also reduces layout complexities for designers since only marker tabs are drawn, which will be resolved into actual connectors later in the process flow, e.g., during the across layer reassignment step. For example, in embodiments, source/drain contacts are connected during design processes to adjacent common metal lines, e.g., power rails, through marker tabs. During ALR, these marker tabs are then reassigned to different layers across the middle stack, e.g., MOL structures. The reassignment can depend on the lithography solution for these layers. As noted above, for situations involving tighter pitches, e.g., 22 nm and beyond technologies, problems between adjacent connectors can be avoided by alternating the connectors (e.g., metal tab or via) such that each connector will be adjacent to a connector at a different level of the metal stack. It is noted that this methodology can be applied in a multi-colored environment on a display of a computing device. It is also noted that in this methodology additional processing steps can be added to the flow to improve yield.

Semiconductor structures manufactured in accordance with the methodology of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor structures in accordance with the present disclosure have been adopted from integrated circuit (IC) technology. For example, the structures are built on wafers and are realized in films of material patterned by photolithographic processes on the top of a wafer. In particular, the fabrication of the semiconductor structures using the present methodology uses three basic building blocks: (i) deposition of thin films of material on a substrate, (ii) applying a patterned mask on top of the films by photolithographic imaging, and (iii) etching the films selectively to the mask.

FIG. 1 shows a design layout 10 for an integrated circuit chip in accordance with the present disclosure. In particular, transistor regions 20, e.g., finFET structures, are provided with source/drain regions 22. The source/drain regions 22 are typically provided by epitaxial deposition and either in-situ doping or ion implantation processes in accordance with well-known techniques. Both the transistor regions 20 and the source/drain regions 22 are surrounded by shallow trench isolation (STI) region 24. Source/drain contacts 26 are provided on the source/drain regions 22. Although this description has been made with regard to transistor regions 20 of finFET structures, the present disclosure is not limited to such devices. For example, the present disclosure can be utilized with a variety of FDSOI devices, and FET devices in general.

In order to connect the source/drain contacts 26 with a common metal line 30, e.g., a power rail, which is spaced apart from the source/drain regions 22 by the STI 24, marker tabs 28 are provided. At the time of the assignment of the marker tabs 28, the actual connection in the manufactured device will be a metal tab is not known. For example, the connection can be at a first level in a metal stack which will be formed above the transistor regions 20 and the source/drain regions 22 and the source/drain contacts 26, or a via to a metal via tab crossing over the STI at a second level in the metal stack, which is a different level than the first level.

It is noted that the present disclosure is not limited to such first and second levels, but could also be practiced in conjunction with additional levels of the metal stack. It is also noted that, in addition to connections between the source/drain contacts 26 and metal lines 30, another group of connectors can be provided for with the marker tabs 28, specifically local connections between contacts within each of the semiconductor elements themselves, rather than between contacts of the semiconductor elements and outside lines.

In embodiments, the marker tabs 28 show where either a metal tab or a via will be placed when across layer reassignment is subsequently performed. In other words, the marker tabs 28 effectively reserve space in the overall design for the ultimate actual connections (i.e., metal tabs or vias). This greatly simplifies the initial assignment of connections during the design phase since, as noted previously, it is often difficult to decide in advance whether the connections should be metal tabs at a first level of the metal stack or metal vias to metal via tabs at a second different level of the metal stack.

As further shown in FIG. 1, the marker tabs 28 do not have to extend in the same direction. For example, as shown in the lower portion of FIG. 1, in addition to the marker tabs 28 assigned for connecting to the middle line 30 on one side of the source/drain regions 22, additional marker tabs 28' can be provided in the opposite direction from the metal line 30 to connect to other metal lines (not shown) on the opposite side of the source/drain regions 22, as needed.

Figure 2:
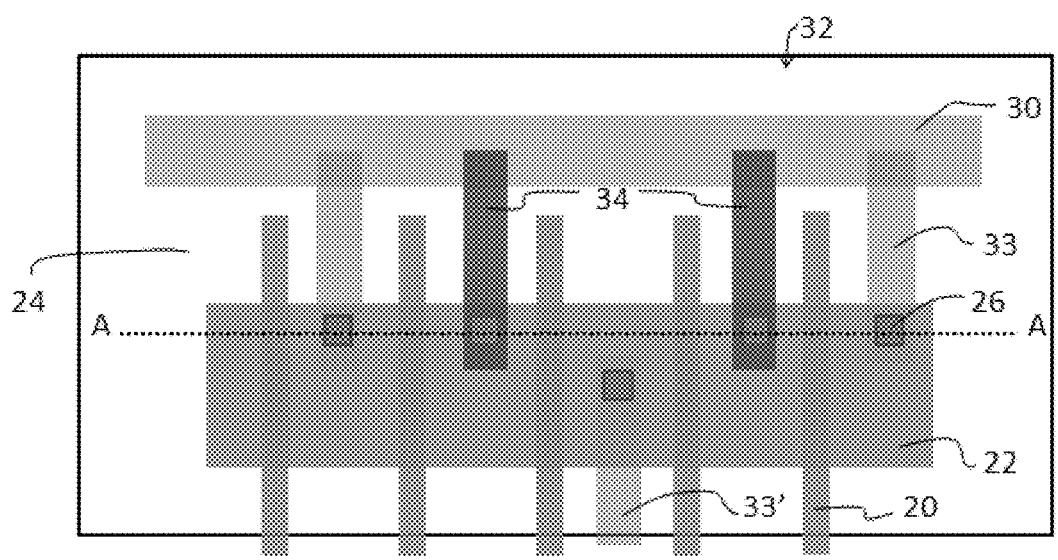
FIG. 2 shows an integrated circuit device structure built from a mask after across layer reassignment (ALR), amongst other features, and respective fabrication processes in accordance with aspects of the present disclosure.

FIG. 2 shows an integrated circuit device structure 32 using a mask developed after across layer reassignment in accordance with the present disclosure. In the structure 32, a first group of the marker tabs 28 shown in FIG. 1 have been reassigned as a first group of connections which are metal tabs 33, and a second group of the marker tabs have been reassigned as a second group of connections which are vias 34. In particular, as discussed above, in order to avoid problems between the connections between the source/drain contacts 26 and the metal line 30 (or other metal lines on an opposite side of the source/drain regions 22, such as shown in the lower portion of FIG. 2), the metal tabs 33 are alternated with the vias 34 so that, in each case, adjacent connections will not be made at the same level in a metal stack overlying the source/drain regions 22 and source/drain contacts 26. In this way, adjacent connections between semiconductor device contacts and outside common metal lines are less likely to short. It is noted that the first group of connections formed as metal tabs on the first level of the metal stack can be formed by the same masking operation or different masking operations. It is also noted that a third group of connections can be formed from a third group of marker tabs, specifically, a local connections between individual contacts within the semiconductor elements themselves, rather than connections between contacts of the semiconductor elements and outside metal lines.

Figure 3:
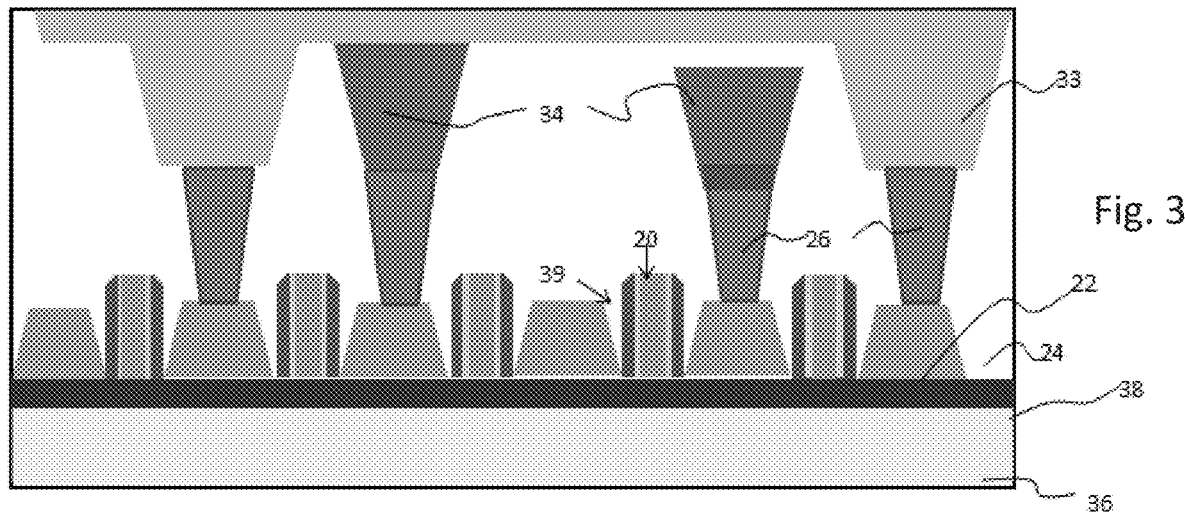
FIG. 3 shows a cross-section of FIG. 2 along the cross-sectional line A-A, amongst other features, and respective fabrication processes, in accordance with aspects of the present disclosure.

FIG. 3 shows a cross-sectional view taken along the cross-sectional line A-A of the IC device structure shown in FIG. 2. In this arrangement, the transistor structures 20 and the source/drain regions 22 are formed over a substrate 36 with an insulator 38 interposed. By way of example, the substrate 36 may be composed of any suitable material including, but not limited to Si, SiGe, SiGeC, SiC, GE alloys, GaAs, InAs, InP and other III/V or II/VI compound semiconductors. The insulator 38 may be composed of any suitable material including, but not limited to, $SiO_2$, SiC, $Si_3N_4$, etc.

As can be appreciated from FIG. 3, the transistor structures 20 can be FET structures (including, for example finFET structures, even though these devices typically do exhibit punch through problems such as described herein). The source/drain regions 22 are formed by conventional in-situ or ion implantation processing in the fin or under the transistor structures 20. As discussed previously, the source/drain contacts 26 extend upwardly from the source/drain regions 22 into contact with either the metal tabs 33, which will cross over the STI region at a first level of a metal stack, or into contact with metal vias 34 which extend to a second different level in the metal stack to a metal via tab which will extend over the STI region at a different level than the metal tabs 33.

In embodiments, the fins can be formed by an SIT technique. In an example of a SIT technique, a mandrel material, e.g., $SiO_2$, is deposited on a substrate using conventional CVD processes. A resist is formed on the mandrel material, and exposed to light to form a pattern (openings). A reactive ion etching is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped.

Following the fin formation, the transistors can be formed by conventional deposition and masking, followed by forming of sidewalls 39. The source and drain contacts 26 can then be formed on the fins, adjacent to the gate structures of the transistors, as already described herein. The metallization structures, e.g., wiring structures or interconnect structures, including the metal tabs 33 and the vias 34 are formed by conventional lithography, etching and deposition methods known to those of skill in the art. For example, a resist formed over an insulator material is exposed to energy (light) to form a pattern (opening). An etching process with a selective chemistry, e.g., reactive ion etching (RIE), will be used to form one or more trenches in the insulator material through the openings of the resist. The resist can then be removed by a conventional oxygen ashing process or other known stripants. Following the resist removal, the material can be deposited by any conventional deposition processes, e.g., chemical vapor deposition (CVD) processes, followed by conventional Chemical Mechanical Polishing (CMP) processes to form the wiring structures or interconnection structures, including the metal tabs 33 of the vias 34. Any residual material on the surface of the insulator material can be removed by conventional chemical mechanical polishing (CMP) processes.

Figure 4:
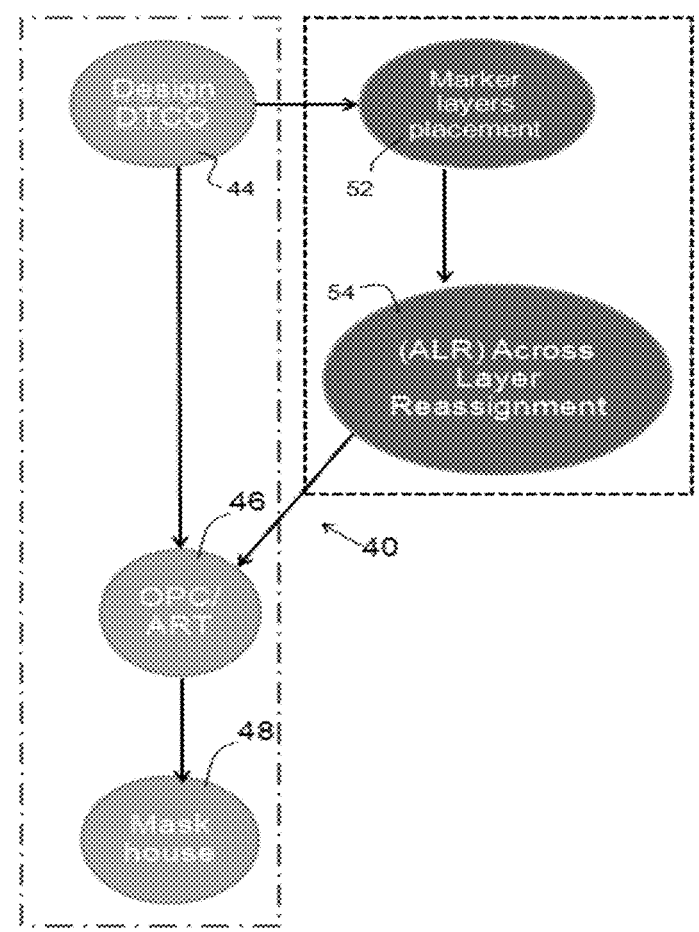
FIG. 4 shows a process flow to design an IC chip and develop a mask for manufacturing an IC chip, in accordance with aspects of the present disclosure.

FIG. 4 shows a process flow for designing the IC chips, and, particularly, to develop masks for actual manufacture of such IC chips in accordance with aspects of the present disclosure. The steps in the dashed lines show standard steps for designing and manufacturing masks. These standard steps include a Design Technical Co-optimization (DTCO) 44, Optical Proximity Correction/Advanced Retargeting (OPC/ART) 46 and a manufacturing of a mask 48. In accordance with the present disclosure, steps 52 and 54 are added to the standard steps for providing the improvements discussed herein. These steps include a marker layer placement step 52 and Across Layer Reassignment (ALR) 54 performed after the DTCO 44 and prior to the OPC/ART 46. An advantage of this is that designers do not have to determine which layer to draw out for connections in the marker layer placement step 52. In embodiments, the steps 44, 46, 52 and 54 can be performed using a computing infrastructure shown in FIG. 5.

The marker layer placement 52 corresponds to the features shown in FIG. 1 regarding the use of marker tabs 28 during the initial assignment for connections between contacts, e.g., source drain contacts 26 and a metal line or layer 30, which is separated from the source/drain regions 22 by region 24. Step 54 corresponds to the features shown in FIG. 2 and FIG. 3, after across layer reassignment has taken place.

It is noted that after final layer assignment has been made based upon the reassignment of the marker tabs performed at step 54, additional processing steps can be performed to improve yield. For example, corners of the vias 34 could be cut off to ensure adequate spacing of adjacent ones of the vias 34.

Figure 5:
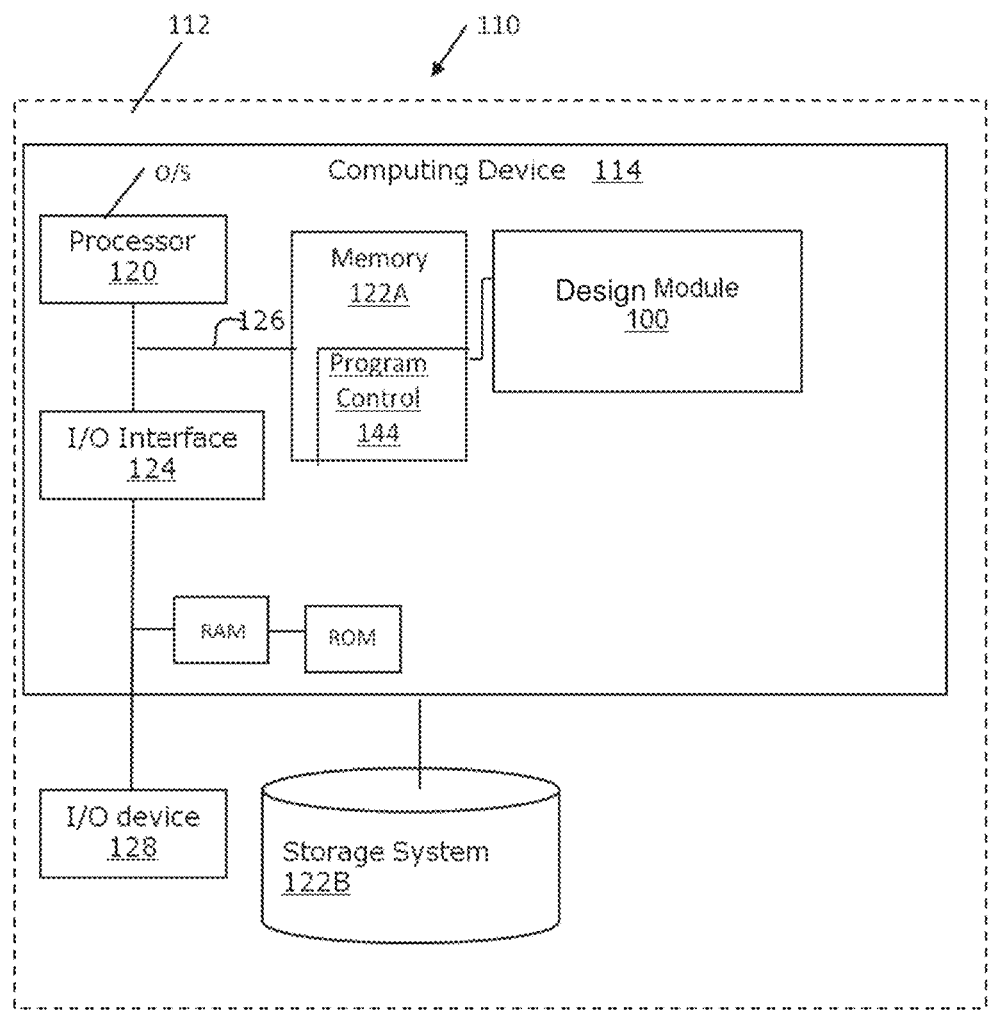
FIG. 5 is a computer infrastructure used in semiconductor design, manufacture, and/or test.

FIG. 5 shows a computer infrastructure for implementing a flow diagram of a design process used in semiconductor design, manufacture, and/or test. The design structures shown herein can be processed and/or generated using machine-readable storage media (non-transitory devices) to include data and/or instructions that, when executed or otherwise processed on a data processing system (e.g., computing infrastructure of FIG. 5), generate a logically, structurally, mechanically, or otherwise functionally equivalent representation of hardware components, circuits, devices, or systems as described herein, e.g., metal tabs and vias at different levels of the device. More specifically, FIG. 5 shows an illustrative environment 110 for managing the processes in accordance with the invention. The environment 110 includes a server or other computing system 112 that can perform the processes described herein. In embodiments, the illustrative environment may be used in an integrated circuit design system as shown illustratively in FIG. 4; although integrated circuit design systems are also contemplated by the present invention. The computing system 112 includes a computing device 114 which can be resident on or communicate with a network infrastructure or other computing devices.

The computing device 114 includes a processor 120, memory 122A, an I/O interface 124, and a bus 126. In addition, the computing device 114 includes random access memory (RAM), a read-only memory (ROM), and an operating system (O/S). The computing device 114 is in communication with an external I/O device/resource 128 and the storage system 122B. The I/O device 128 can comprise any device that enables interaction with the computing device 114 (e.g., user interface) or any device that enables the computing device 114 to communicate with one or more other computing devices using any type of communications link or any device that enables the computing device 114 to interact with its environment to carry out assignment of marker tabs to reserve space for future connections between semiconductor device contacts and metal lines and the reassignment of the marker tabs as metal tabs or vias, as described herein.

The processor 120 executes computer program code (e.g., program control 144), which can be stored in the memory 122A and/or storage system 122B. While executing the computer program code, the processor 120 can read and/or write data to/from memory 122A, storage system 122B, and/or I/O interface 124. The program code 144 executes the processes of the invention such as, for example, assigning marker tabs to reserve space for future connections between contacts of a semiconductor device, such as source/drain contacts, and common metal lines spaced apart from the contact, for example by STI layers, amongst other features described herein.

The computing device 114 includes a design module 100, which can be implemented as one or more program code in the program control 144 stored in memory 122A as a separate or combined module. Additionally, the design module 100 may be implemented as separate dedicated processors or a single or several processors to provide the functionality of this tool. Moreover, it should be understood by those of ordinary skill in the art that the design module 100 is used as a general descriptive term for providing the features and/or functions of the present invention, and that the design module 100 may comprise many different components such as, for example, the components and/or infrastructure described and shown with reference to FIGS. 1-4.

In embodiments, the design module 100 is operative and/or configured to provide connections using multiple layers across a metal stack to connect contacts of semiconductor devices to common metal lines, in spite of very tight pitches, without punch through shorts and with acceptable PV band variations. As an example, the design module 100 can provide a design to connect source/drain contacts of multiple semiconductor devices to a metal line which is common to the source/drain contacts and separated from the source/drain contacts by an STI layer. More particularly, the design module 100 can assign marker tabs to reserve space for future connections between the source/drain contacts and the common metal line. The design module 100 can then perform across layer reassignment of the marker tabs to assign a first group of the marker tabs to be metal tabs to connect a first group of the source/drain contacts to the common metal line at first level of the metal stack formed over the source/drain contacts and the STI layer. The design module hundred can also assign a second group of the marker tabs to be vias to connect a second group of the source/drain contacts to the common metal line at a second layer of the metal stack which is at a different level than the first layer.

The design structure may be a logical simulation design structure generated and processed by design process to produce a logically equivalent functional representation of a hardware device. Design structure may also or alternatively comprise data and/or program instructions that when processed by design process, generate a functional representation of the physical structure of a hardware device. Whether representing functional and/or structural design features, design structure may be generated using electronic computer-aided design (ECAD) such as implemented by a core developer/designer. When encoded on a machine-readable data transmission, gate array, or storage medium, design structure may be accessed and processed by one or more hardware and/or software modules within the computer infrastructure in FIG. 5 to simulate or otherwise functionally represent an electronic component, circuit, electronic or logic module, apparatus, device, or system such as those shown in FIGS. 1-4. Such data structures may include hardware-description language (HDL) design entities or other data structures conforming to and/or compatible with lower-level HDL design languages such as Verilog and VHDL, and/or higher level design languages such as C or C++.

The design process can employ and incorporate hardware and/or software modules for synthesizing, translating, or otherwise processing a design/simulation functional equivalent of the components, circuits, devices, or logic structures shown in FIGS. 1-4 to generate a netlist which may contain design structures such as design structure. A netlist may comprise, for example, compiled or otherwise processed data structures representing a list of wires, discrete components, logic gates, control circuits, I/O devices, models, metal contacts 33 and vias 34 etc. that describes the connections to other elements and circuits in an integrated circuit design, as shown in FIGS. 1-4. A netlist may be synthesized using an iterative process in which the netlist is resynthesized one or more times depending on design specifications and parameters for the device. As with other design structure types described herein, the netlist may be recorded on a machine-readable data storage medium or programmed into a programmable gate array (e.g., a non-transitory device). The design process may include hardware and software modules, e.g., module 100, for processing a variety of input data structure types including the netlist. Such data structure types may reside, for example, within library elements and include a set of commonly used elements, circuits, and devices, including models, layouts, and symbolic representations, for a given manufacturing technology (e.g., different technology nodes, 22 nm, etc.). The data structure types may further include design specifications, characterization data, verification data, design rules, and test data files which may include input test patterns, output test results, and other testing information.

The design process employs and incorporates logic and physical design tools such as HDL compilers and simulation model build tools to process the design structure together with some or all of the depicted supporting data structures along with any additional mechanical design or data (if applicable), to generate a second design structure.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method implemented in a computer infrastructure comprising:
    assigning marker tabs for connecting contacts of semiconductor elements to a metal line to reserve space for future connections between the contacts and the metal line; and
    reassigning the marker tabs to connections between the contacts and the metal line on different levels of a metal stack formed over the semiconductor elements, wherein the connections between the contacts and the metal line comprise a first group of connections comprised of metal tabs on a first level of the metal stack and a second group of connections comprised of vias to connect the contacts to the metal line on a second level of the metal stack which is at a different level than the first level of the metal stack, and the method assigns the first and second groups of connections to alternate the metal tabs and the vias with one another to separate adjacent metal tabs from one another by a via.

2. The method of claim 1, wherein the contacts are source/drain contacts formed on the semiconductor elements.

3. The method of claim 2, wherein the source/drain contacts are surrounded by a Shallow Trench Isolation (STI) layer.

4. The method of claim 3, wherein the connections between the source/drain contacts and the metal line occur after the reassignment of the marker tabs.

5. The method of claim 1, wherein the metal tabs of the first group of connections formed on the first level of the metal stack are formed by different masking operations.

6. The method of claim 1, further comprising a third group of connections comprised of local connections within each of the semiconductor elements.

7. The method of claim 1, further comprising performing at least one additional processing step, after the reassignment to form the first and second groups of connections, to improve yield based on a final layer assignment after reassignment of the marker tabs.

8. The method of claim 7, wherein the additional processing comprising cutting off corners of the vias to ensure adequate spacing of adjacent ones of the vias.

9. The method of claim 8, wherein the metal tabs are located between two vias of the vias.

10. The method of claim 8, wherein the vias are located between two metal tabs of the metal tabs.

11. The method of claim 10, wherein the semiconductor elements are surrounded by a Shallow Trench Isolation (STI) layer.

12. The method of claim 11, wherein the contacts are surrounded by the STI layer.

13. A system for connecting source/drain contacts surrounded by an STI layer to a metal line, the system comprising a CPU, a computer readable memory and a computer readable storage device, and configured to:
    connect the source/drain contacts to the metal line with marker tabs to reserve space for future connections between the source/drain contacts and the metal line; and
    perform across layer reassignment of the marker tabs to assign a first group of the marker tabs to be metal tabs to connect a first group of the source/drain contacts to the metal line at a first level of a metal stack formed over the source/drain contacts and the STI layer, and to assign a second group of the marker tabs to be vias to connect a second group of the source/drain contacts to the metal line at a second layer of the metal stack which is at a different level than the first layer of the metal stack, wherein the system is further configured to assign the first and second groups of marker tabs to alternate the metal tabs and the vias with one another to separate adjacent metal tabs from one another by a via.

14. The system of claim 13, wherein the metal tabs formed on the first level of the metal stack are formed by different masking operations.

15. The system of claim 13, wherein the system is further configured to assign a third group of the marker tabs to be connections comprised of local connections within each of the semiconductor elements.

16. The system of claim 13, further comprising performing at least one additional processing step, after reassignment to form the metal tabs and vias, to improve yield based on a final layer assignment after reassignment of the marker tabs.

17. The system of claim 16, wherein the additional processing comprising cutting off corners of the vias to ensure adequate spacing of adjacent ones of the vias.

18. A computer program product comprising a computer readable hardware storage device having readable program code embodied in the computer readable hardware storage device, the computer program product including at least one component operable to:
    assign marker tabs to connect contacts of semiconductor elements to a metal line to reserve space for future connections between the contacts and the metal line; and
    reassign the marker tabs to connections between the contacts and the metal line on different levels of a metal stack formed over the semiconductor elements, wherein the contacts are source/drain contacts formed on the semiconductor elements, the connections between the source/drain contacts and the metal line after the reassignment of the marker tabs comprise a first group of connections comprised of metal tabs on a first level of the metal stack and a second group of connections comprised of vias to connect the source/drain contacts to the metal line on a second level of the metal stack which is at a different level than the first level of the metal stack, and the first and second groups of connections are assigned to alternate the metal tabs and the vias with one another to separate adjacent metal tabs from one another by a via.

19. The computer program product of claim 18, wherein the source/drain contacts are surrounded by a Shallow Trench Isolation (STI) layer.

20. The computer program product of claim 19, wherein the connections between the source/drain contacts and the metal line after the reassignment of the marker tabs comprise a first group of connections comprised of metal tabs on a first level of the metal stack and a second group of connections comprised of vias to connect the source/drain contacts to the metal line on a second level of the metal stack which is at a different level than the first level of the metal stack.

\* \* \* \* \*